United States Patent
Chen et al.

(10) Patent No.: US 10,332,750 B2
(45) Date of Patent: Jun. 25, 2019

(54) METHOD FOR FABRICATING SEMICONDUCTOR DEVICE WITH STRAINED SILICON STRUCTURE

(71) Applicant: UNITED MICROELECTRONICS CORP., Hsin-Chu (TW)

(72) Inventors: Kuang-Hsiu Chen, Tainan (TW); Hsu Ting, Tainan (TW); Chung-Fu Chang, Tainan (TW); Shi-You Liu, Kaohsiung (TW); Chun-Wei Yu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/820,443

(22) Filed: Nov. 22, 2017

(65) Prior Publication Data

US 2019/0157455 A1    May 23, 2019

(51) Int. Cl.
*H01L 21/3105* (2006.01)
*H01L 29/78* (2006.01)
*H01L 29/66* (2006.01)
*H01L 21/02* (2006.01)
*H01L 21/265* (2006.01)
*H01L 29/165* (2006.01)
*H01L 21/266* (2006.01)
*H01L 21/324* (2006.01)
*H01L 29/08* (2006.01)

(52) U.S. Cl.
CPC .... *H01L 21/3105* (2013.01); *H01L 21/02532* (2013.01); *H01L 21/266* (2013.01); *H01L 21/26533* (2013.01); *H01L 21/26586* (2013.01); *H01L 21/324* (2013.01); *H01L 29/0847* (2013.01); *H01L 29/165* (2013.01); *H01L 29/66636* (2013.01); *H01L 29/7848* (2013.01)

(58) Field of Classification Search
CPC .......... H01L 29/7848; H01L 21/26586; H01L 29/0847; H01L 21/324; H01L 21/266; H01L 21/26533; H01L 21/02532; H01L 29/66636; H01L 29/165; H01L 29/823418; H01L 29/823814; H01L 21/02356; H01L 21/3105
See application file for complete search history.

(56) References Cited

U.S. PATENT DOCUMENTS

| | | | |
|---|---|---|---|
| 9,048,129 B2 | 6/2015 | Liu | |
| 2007/0138570 A1 | 6/2007 | Chong | |
| 2007/0298557 A1* | 12/2007 | Nieh | ................ H01L 21/26586 438/197 |
| 2013/0341685 A1* | 12/2013 | Chou | .................. H01L 29/6653 257/288 |

* cited by examiner

*Primary Examiner* — Laura M Menz
*Assistant Examiner* — Candice Chan
(74) *Attorney, Agent, or Firm* — Winston Hsu

(57) ABSTRACT

A method for fabricating a semiconductor device. A gate is formed on a substrate. A spacer is formed on each sidewall of the gate. A hard mask layer is formed on the spacer. A recessed region is formed in the substrate and adjacent to the hard mask layer. An epitaxial layer is formed in the recessed region. The substrate is subjected to an ion implantation process to bombard particle defects on the hard mask layer with inert gas ions. An annealing process is performed to repair damages to the epitaxial layer caused by the ion implantation process. The hard mask layer is then removed.

11 Claims, 3 Drawing Sheets

US 10,332,750 B2

METHOD FOR FABRICATING SEMICONDUCTOR DEVICE WITH STRAINED SILICON STRUCTURE

BACKGROUND OF THE INVENTION

1. Field of the Invention

The present invention relates generally to the field of semiconductor technology. More particularly, the present invention relates to a method for fabricating a semiconductor device with a strained-silicon structure.

2. Description of the Prior Art

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include strain layers such as epitaxial SiGe layers. Typically, prior to the growth of the epitaxial SiGe layers in the source and drain regions, a SiN hard mask is formed on the spacers of the gate stack. After the growth of the epitaxial SiGe layers, the SiN hard mask is removed. However, SiGe fall-on defects are difficult to be removed by the SiN hard mask removing process.

Therefore, there is a need of providing an improved method for fabricating the semiconductor device to obviate the drawbacks encountered from the prior art.

SUMMARY OF THE INVENTION

One aspect of the present disclosure is to provide a method for fabricating a semiconductor device . A gate is formed on a substrate. A spacer is formed on each sidewall of the gate. A hard mask layer is formed on the spacer. A recessed region is formed in the substrate and adjacent to the hard mask layer. An epitaxial layer is formed in the recessed region. The substrate is subjected to an ion implantation process to bombard particle defects on the hard mask layer with inert gas ions. An annealing process is performed to repair damages to the epitaxial layer caused by the ion implantation process. The hard mask layer is then removed.

According to one embodiment, for example, the ion implantation process may be a tilt-angle ion implantation process. According to one embodiment, for example, the inert gas ions may comprise argon gas, nitrogen gas, helium, neon, krypton, or xenon. For example, the inert gas ions may be implanted at a tilt angle θ of about approximately 0° to 15°. An energy of the inert gas ions may range between 0~5 KeV. A dosage of the inert gas ions may range between 1E13~1E16 atoms/$cm^2$.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
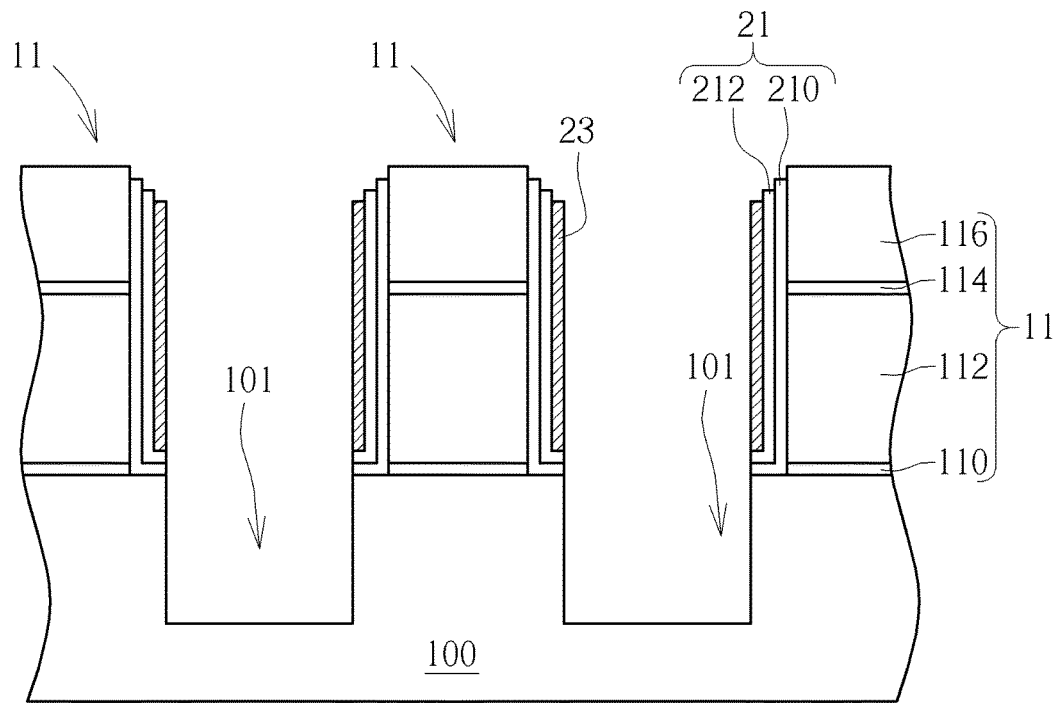
FIG. 1 to FIG. 4 are schematic, cross-sectional diagrams showing a method for fabricating a semiconductor device with a strained-silicon structure according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

As described in the embodiments herein, steps such as deposition, patterning or etching of various films (including conductive films, metals, dielectric layers, etc.) can be accomplished using known processes such as chemical vapor deposition, physical vapor deposition, sputtering, atomic layer deposition, optical lithography processes, plasma dry etching, wet etching, reactive ion etching, and the like, the details of which will not be repeated.

Please refer to FIG. 1 to FIG. 4. FIG. 1 to FIG. 4 are schematic, cross-sectional diagrams showing a method for fabricating a semiconductor device with a strained-silicon structure according to one embodiment of the invention. As shown in FIG. 1, a substrate 100 such as a semiconductor substrate is provided. For example, the substrate 100 may be a silicon substrate, but is not limited thereto. According to one embodiment, the substrate 100 may comprise a fin structure.

According to one embodiment, a plurality of gates 11 may be formed on the substrate 100. According to one embodiment, for example, each of the plurality of gates 11 may comprise a gate dielectric layer 110, a polysilicon layer 112, a silicon oxycarbonitride (SiOCN) layer 114, and a silicon oxide cap layer 116.

According to one embodiment, a sidewall spacer 21 is formed on each sidewall of the gate 11. According to one embodiment, for example, the sidewall spacer 21 may comprise a first spacer film 210 and a second spacer film 212. The first spacer film 210 may be formed by using conventional chemical vapor deposition (CVD) or atomic layer deposition (ALD) methods, but is not limited thereto.

For example, the first spacer film 210 may SiCN-based materials such as SiCN or SiOCN, but is not limited. For the simplicity of the description, the LDD (lightly-doped drain) regions and the relevant process steps are omitted in the embodiment.

According to one embodiment, the second spacer film 212 may be formed by using conventional CVD or ALD methods, but is not limited thereto. For example, the second spacer film 212 may SiCN-based materials such as SiCN or SiOCN, but is not limited.

Subsequently, a hard mask layer 23 is formed on the spacer 21. More specifically, the hard mask layer 23 is formed on the second spacer film 212 of the spacer 21. According to one embodiment, for example, the hard mask layer 23 may comprise silico nitride, but is not limited thereto. Recessed regions 101 may be etched into the substrate 100 and may be adjacent to the hard mask layer 23 after the formation of the spacer 21 and the hard mask layer 23.

Figure 2:
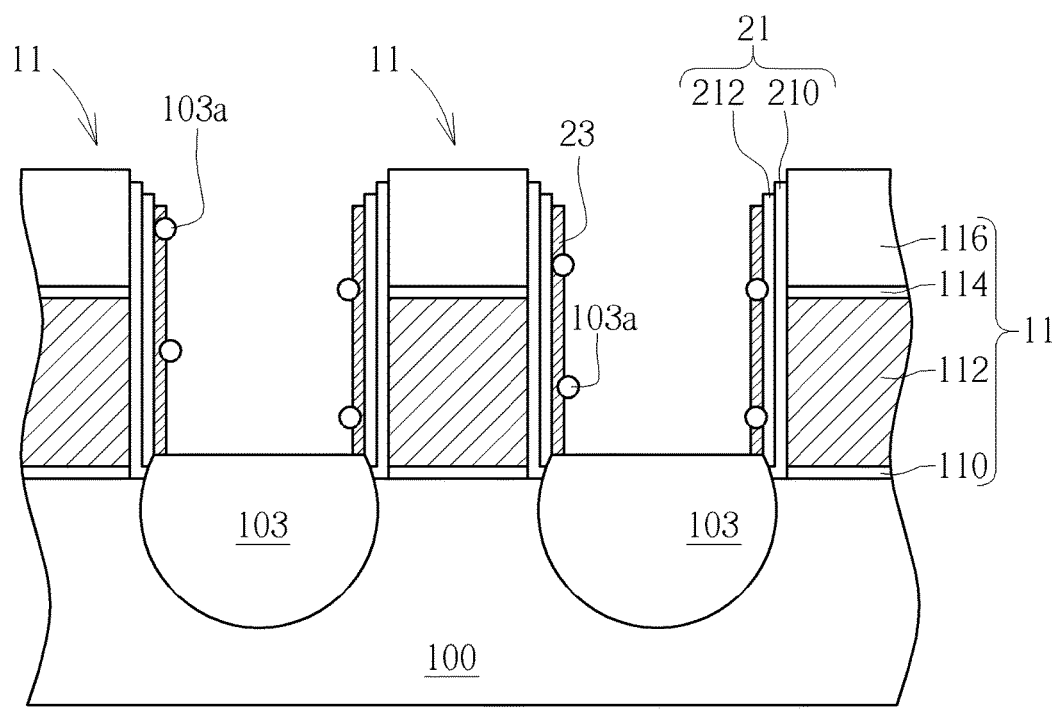

As shown in FIG. 2, subsequently, an epitaxial layer 103 is formed in each recessed region 101 to thereby form the source/drain region of a transistor. According to one embodiment, for example, the epitaxial layer 103 may be formed by using a selective epitaxial growth (SEG) process. According to one embodiment, for example, the epitaxial layer 103 may be a SiGe layer for a PMOS transistor.

During the growth of the epitaxial layer 103, fall-on defects or particle defects 103a including SiGe may be formed on the outer surface of the hard mask layer 23. The fall-on defects or particle defects 103a may penetrate through the hard mask layer 23 and may form granular structures, which are difficult to be removed by the subsequent SiN hard mask removing process. The instant invention addresses this issue.

Figure 3:
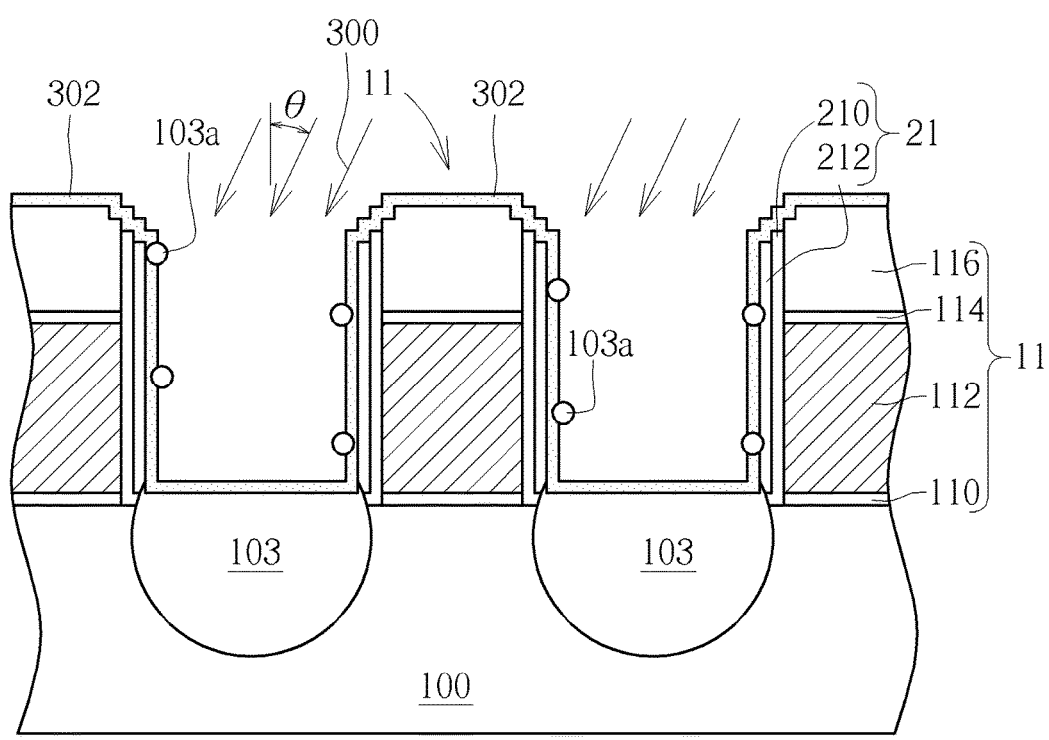

As shown in FIG. 3, after the SEG process, the substrate 100 and the features including the gates 11, the spacers 21, the hard mask layer 23 and the fall-on defects or particle defects 103a on the substrate 100 are subjected to an ion implantation process 300. The fall-on defects or particle defects 103a on the hard mask layer 23 are bombarded with inert gas ions during the ion implantation process 300. The ion bombardment may alter the fall-on defects or particle defects 103a from the granular structure to an amorphous structure that is more easily to be removed by the subsequent SiN hard mask removing process.

According to one embodiment, for example, the ion implantation process 300 may be a tilt-angle ion implantation process. According to one embodiment, for example, the inert gas ions may comprise argon gas, nitrogen gas, helium, neon, krypton, or xenon. For example, the inert gas ions may be implanted at a tilt angle θ of about approximately 0° to 15°. An energy of the inert gas ions may range between 0~5 KeV, for example, 1.5 KeV. A dosage of the inert gas ions may range between 1E13~1E16atoms/cm$^2$.

According to one embodiment, due to the bombardment of inert gas ions, a thin surface layer 302 having an amorphous structure may be formed on the gates 11, the spacers 21, the hard mask layer 23 and the top surface of the epitaxial layer 103.

According to one embodiment, after the ion implantation process 300, an annealing process is performed to repair damages to the epitaxial layer 103 caused by the ion implantation process 300. According to one embodiment, for example, the annealing process may comprise laser annealing, furnace annealing or rapid thermal annealing, but is not limited thereto. The annealing process may be performed at a temperature of about 1250° C.

Figure 4:
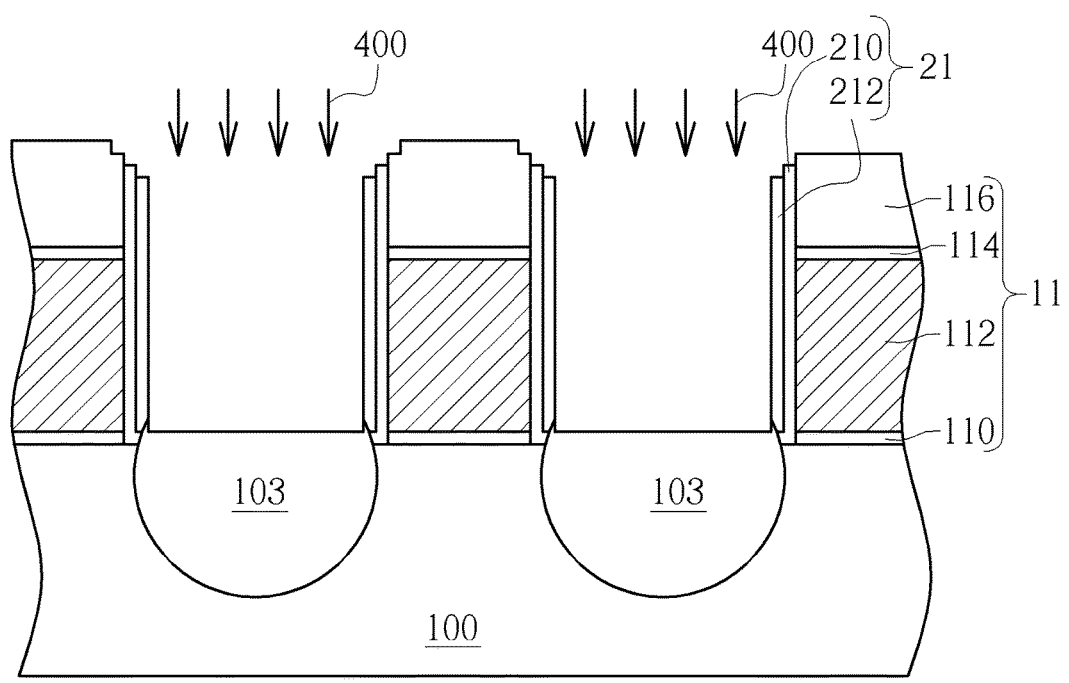

As shown in FIG. 4, after the annealing process, the hard mask layer 23 and the fall-on defects or particle defects 103a on the hard mask layer 23 are removed by using SiN hard mask removing process such as hot phosphoric acid wet etching. Since the top surface that was damaged by the ion implantation process 300 has been restored by the annealing process, the SiGe loss can be minimized during the removal of the hard mask layer 23 and the fall-on defects or particle defects 103a.

According to one embodiment, another ion implantation process 400 may be carried out to implant dopants such as boron ions into the epitaxial layer 103. It is understood that the sequence if the ion implantation process 400 for implanting dopants into the epitaxial layer 103 and the ion implantation process 300 is not limited. Those skilled in the art would easily realize that the ion implantation process 400 may be performed before the ion implantation process 300.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate;
   forming a gate on the substrate;
   forming a spacer on a sidewall of the gate;
   forming a hard mask layer on the spacer;
   forming a recessed region in the substrate and adjacent to the hard mask layer;
   forming an epitaxial layer in the recessed region;
   altering particle defects on the hard mask layer from a granular structure to an amorphous structure;
   performing an annealing process to repair damages to the epitaxial layer; and
   removing the hard mask layer and the particle defects on the hard mask layer.

2. The method according to claim 1, wherein said altering particle defects on the hard mask layer from a granular structure to an amorphous structure comprises subjecting the substrate to an ion implantation process with inert gas ions, and wherein the ion implantation process is a tilt-angle ion implantation process.

3. The method according to claim 2, wherein the inert gas ions are implanted at a tilt angle of about approximately 0° to 15°.

4. The method according to claim 3, wherein an energy of the inert gas ions ranges between 0~5 KeV.

5. The method according to claim 4, wherein a dosage of the inert gas ions ranges between 1E13~1E16atoms/cm$^2$.

6. The method according to claim 1, wherein the inert gas ions comprise argon gas, nitrogen gas, helium, neon, krypton, or xenon.

7. The method according to claim 1, wherein the annealing process is performed at a temperature of about 1250° C.

8. The method according to claim 1, wherein the annealing process comprises laser annealing, furnace annealing or rapid thermal annealing.

9. The method according to claim 1, wherein the hard mask layer comprises silicon nitride.

10. The method according to claim 1, wherein the spacer comprises SiOCN.

11. The method according to claim 1, wherein the epitaxial layer comprises SiGe.

* * * * *